Sept. 29, 1970 T. M. ELFVING 3,531,330

THERMOELECTRIC ASSEMBLIES

Filed Oct. 27, 1966

6 Sheets-Sheet 1

INVENTOR.
THORE M ELFVING
BY Fleit Hohlbock Test
Albritton & Herbert

ATTORNEYS

Sept. 29, 1970

T. M. ELFVING 3,531,330

THERMOELECTRIC ASSEMBLIES

Filed Oct. 27, 1966

6 Sheets-Sheet 2

INVENTOR.
THORE M. ELFVING
BY Fleit, Hohlbock, Test
Albritton & Herbert
ATTORNEYS INVENTOR.
THORE M. ELFVING
BY Fields, Halbach, Test, Albertini & Herbert
ATTORNEYS Sept. 29, 1970 T. M. ELFVING 3,531,330

THERMOELECTRIC ASSEMBLIES

Filed Oct. 27, 1966

6 Sheets-Sheet 4

INVENTOR.
THORE M. ELFVING
BY Fleit, Hubbard, Tust, Albritton & Herbert
ATTORNEYS INVENTOR.
THORE M. ELFVING
BY Fleit, Hohbach, Test, Albritton & Herbert
ATTORNEYS Sept. 29, 1970 T. M. ELFVING 3,531,330

THERMOELECTRIC ASSEMBLIES

Filed Oct. 27, 1966 6 Sheets-Sheet 6

INVENTOR.
THORE M. ELFVING
BY Flehr, Hohbach, Test
Albritton & Herbert
ATTORNEYS

United States Patent Office 3,531,330
Patented Sept. 29, 1970

3,531,330
THERMOELECTRIC ASSEMBLIES
Thore M. Elfving, 433 Fairfax Ave., San Mateo, Calif. 94402
Filed Oct. 27, 1966, Ser. No. 590,070
Int. Cl. H01v *1/30*
U.S. Cl. 136—203 15 Claims

ABSTRACT OF THE DISCLOSURE

A thermoelectric assembly including couples or subcouples each having a separate heat exchanger to air in direct electrical and heat conductive contact with the corresponding junction bridge and means forcing the heat exchanger against the junction bridge to provide good electrical and heat conductive contact between the parts of the assembly.

The present invention is directed generally to thermoelectric assemblies and more particularly to thermoelectric heat pumping and generating assemblies of the liquid to air and air to air types for lowering the temperature of one of the fluid media or for producing electric power.

The invention is specifically directed to the design of improved couple or subcouple assemblies suitable for mass manufacture and subsequent mounting into larger assemblies.

The improved and simplified assemblies according to the invention include not only semiconductive bodies with their critical joints and junction bridges but also adjoining heat transfer means in pressure contact with said junction bridges and prestressing means both for the protection of the fragile semiconductive bodies and for creating the pressure contacts between the junction bridges and adjoining heat transfer means.

In my copending application Ser. No. 543,322, filed Apr. 18, 1966, now Pat. No. 3,360,942 dated Jan. 2, 1968 entitled "Thermoelectric Heat Pump Assembly," there has been described liquid to air and air to air assemblies using finned tubing sections on the air side in combination with means for applying a prestressing force which can be so strong that a good electric and heat conductive connection is obtained between abutting portions of the assembly without soldering. It was pointed out in the above application that the electric contact resistance at aluminum surfaces is prohibitive and that, therefore, such surfaces must be treated in different ways before they can be included in the electric path of the assembly.

In the present invention there is provided thermoelectric assemblies using aluminum heat transfer means which are not included in the electric path and, therefore, do not have to be treated to provide good electrical contacts. Pressure contacts can, according to the present invention, be used both in the electrical path and outside the electrical path. In the former case the abutting surfaces must have special qualities for low electrical resistance and in both cases the heat transfer resistance must be low. When the electrical resistance is low, then the heat transfer resistance is also low. For pressure contacts against aluminum surfaces, the electrical resistance may be high while the heat transfer qualities are more or less the same as for other surfaces. The present invention makes use of this observation by providing couple and/or subcouple assemblies where pressure contacts are used for heat transfer to aluminum heat dissipating or heat absorbing parts which are not included in the electrical path.

It is an object of the present invention to provide a subcouple assembly suitable for incorporation in thermoelectric assemblies including heat transfer means.

It is an object of this invention to provide large, easily assembled, prestressed thermoelectric assemblies having a minimum of parts and requiring no soldering or soldering only at critical points.

Still another object of this invention is to provide critical joints suitable for incorporation in larger systems without soldering.

A further object of this invention is to provide air to air and liquid to air thermocouple assemblies with centrally applied prestressing forces in combination with semiconductive N- and P-layers in the form of one single block each.

Further objects and advantages of this invention will appear from the following description and the accompanying drawings as well as from the claims forming part of the specification.

Referring to the drawings.

Figure 1A:
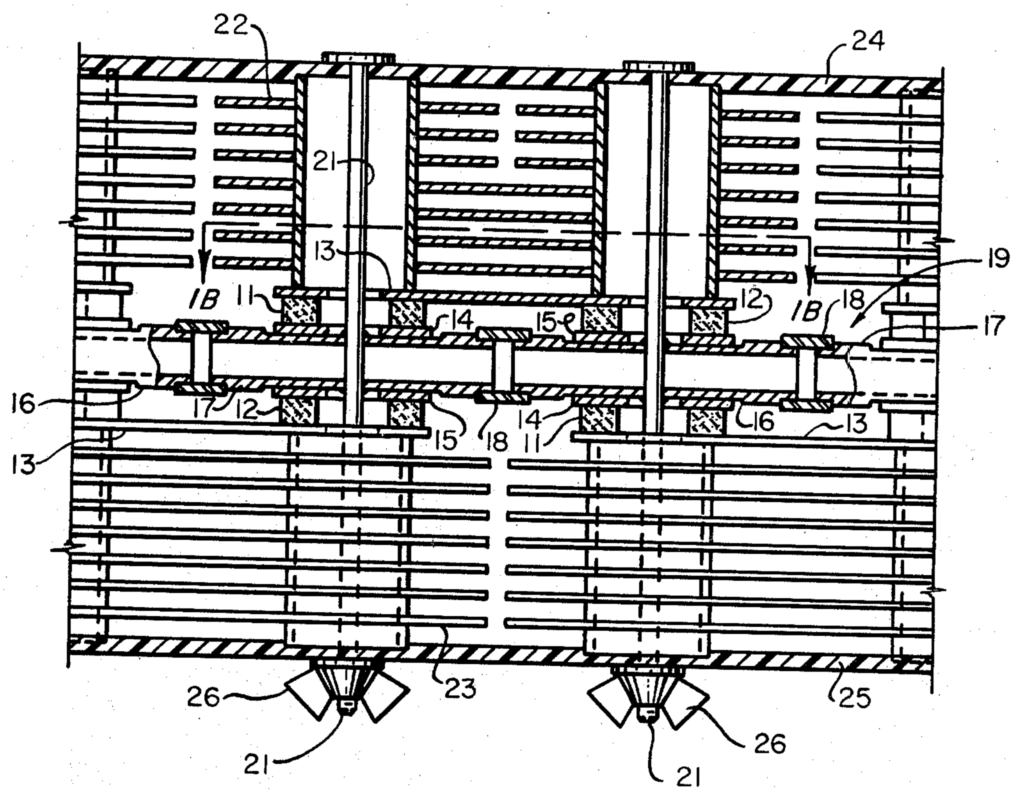
FIG. 1A shows an elevation view, partly in section, of thermocouple assemblies for liquid to air systems, according to the invention.
Figure 1B:
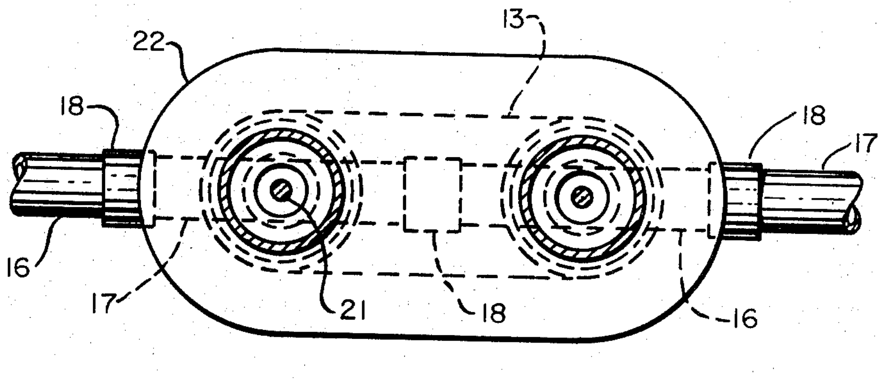
FIG. 1B is a sectional view taken along the line B—B of FIG. 1A.

Referring to FIGS. 1A and 1B, there are shown two couples of an air to liquid heat pump or generating device. N-type and P-type layers 11 and 12 of thermoelectric material, such as bismuth telluride, are soldered pairwise between, preferably nickel-plated copper members of which one member 13 has the form of a bar soldered to similar junction ends of both layers 11 and 12, while two other copper members 14 and 15 are soldered to the other junction ends of each layer 11 and 12, respectively. The described assembly represents a prefabricated subcouple with the critical joints included.

In the assembly shown, the bar 13 forms a junction bridge of one type (hot or cold). Junction bridges of the other type (cold or hot) are formed by pipe sections 16 and 17 insulated from each other by non-conductive ring members 18 which join the pipe sections into a liquid conduit 19. The pipe sections 16 and 17 can, according to the invention, belong to different conduits with their axes parallel to each other (as described in my above copending application).

The prefabricated couple assemblies are pressed with their free members 14 and 15 against flat portions on each side of the copper pipe sections 16 and 17 in the way illustrated by the drawing to form thermocouple in series. The pressing force is achieved by stainless steel rods 21 firmly affixed by brazing to the pipe sections and extending through holes formed in the copper members 13, 14 and 15. The rods 21 also provide central means for attaching finned tubing sections 22 and 23 to the junction bridges 13 on the air side of the assembly. The assembly is disposed between non-conductive shields 24 and 25 and compressed by tightening wing nuts 26 onto the stainless steel rods 21. The finned tubing sections 22 and 23 can be of aluminum and provided with fins of the same material. The fins may be applied to individual tubing sections, or common fins may be provided to accommodate both tubing sections on the bar 13, as shown in the drawing.

The finned tubing, which serves as heat dissipating or heat absorbing members on the air side, does not contribute significantly to electric conductivity of the junction bridge 13 and the electric resistance between the circular base at each end of the copper member 13 and the aluminum centers of the finned tubings is of no importance. The pressure contact between said members provides a good heat transfer which is the main objective. Large heat pump assemblies of this type can be easily mounted between shields 24 and 25. The standardized thermocouples and the liquid conduits can be prefabricated. Several assemblies of the type described can be placed in parallel rows between common side plates or shields. Suitable terminal conductors connect the assemblies to a power supply to provide power thereto for heat pumping. The assembly may serve as a liquid-cooled air conditioner or as an air-cooled liquid cooler for various purposes. The assembly can also utilize the temperature difference between liquid and gas fluids for the production of electric power at the terminal conductors.

Figure 2A:
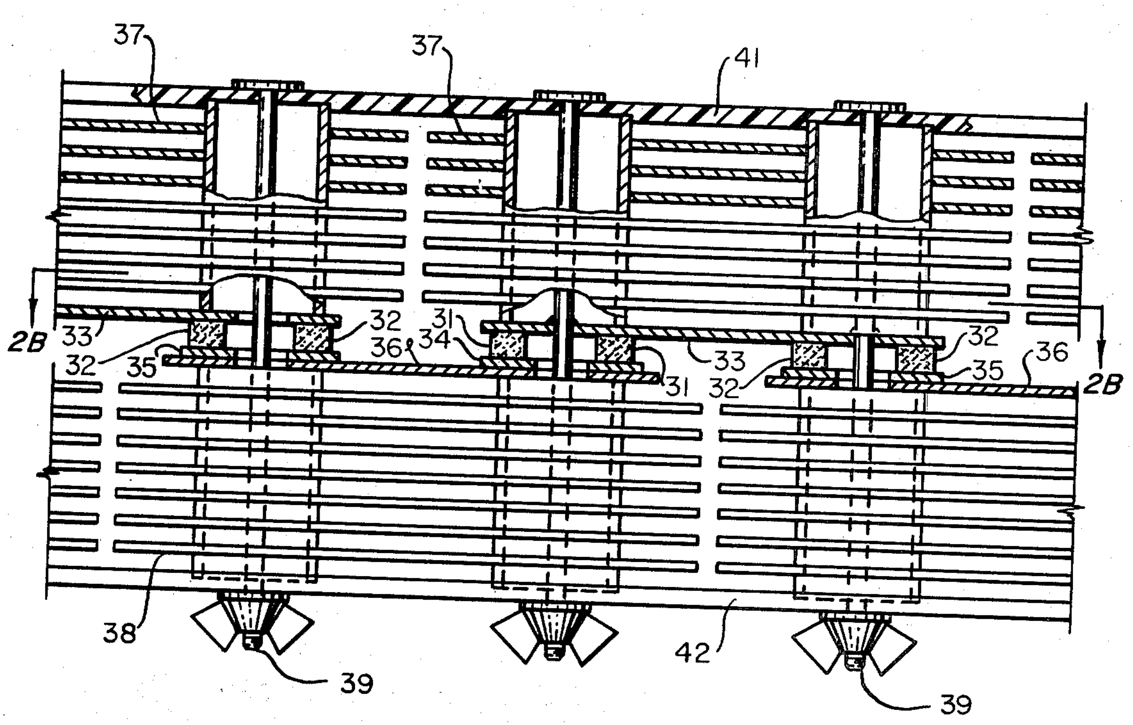
FIG. 2A shows an elevation view, partly in section, of thermocouple assemblies for air to air systems according to the invention.
Figure 2B:
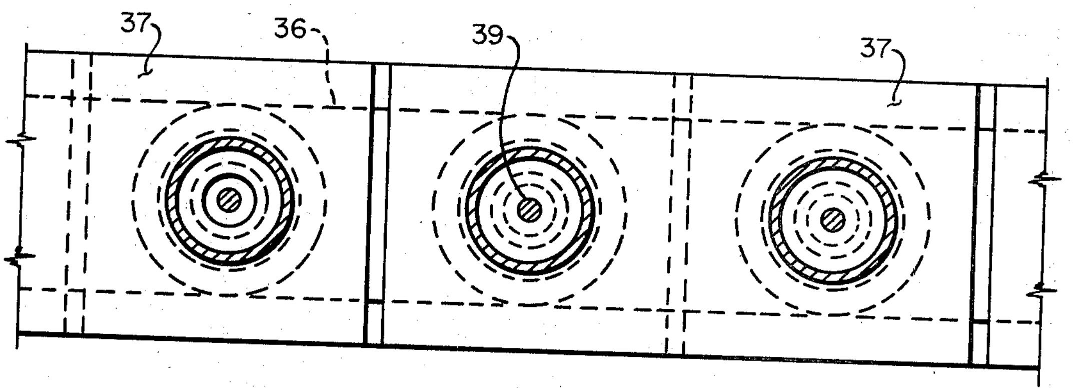
FIG. 2B is a sectional view taken along line B—B of FIG. 2A.

In FIGS. 2A and 2B an air to air heat pump assembly is shown. It is assembled from prefabricated couple assemblies comprising N-type and P-type layers 31 and 32 of thermoelectric material with their critical joints soldered to a copper junction bridge 33 and free copper members 34 and 35 at the other junction ends, respectively. Another copper member in the form of a strap 36 forms the junction bridge between the free members of adjacent couples so that an electric path is formed with the couples in series. The member 36 can be joined to the members 34 and 35 by soldering but can also be attached by pressure contact, in which case the copper surfaces should be suitably treated as described in my above copending application, for instance, by a gold flash on top of silver plating. Such pressure contacts offer negligible electric resistance over a very long period of time. The critical joints can also, according to the invention, use pressure contacts instead of soldering. The surface of the semiconductive layer or block can then be suitably treated, for instance, nickel-plated, silvered and provided with a gold flash. A contact pressure of several thousand p.s.i. can be applied at the critical joints with electric contact resistance much below allowable maximum values for soldered joints.

The junction bridges 33 and 36 are, according to the invention, provided with heat-adsorbing and heat-dissipating members in the form of finned aluminum tubings 37 having common fins as illustrated. The aluminum heat transfer members are pressed against the copper junction bridges by central stainless steel rods 39 which holds the whole assembly together. Pressure is applied between side members 41 and 42 of suitable non-conductive material through rods 39. The rods 39 can be firmly affixed to one of the junction bridges 33 and pass through holes in the other copper members or be entirely loose and affixed only to the side members, as illustrated in the drawing.

Figure 3A:
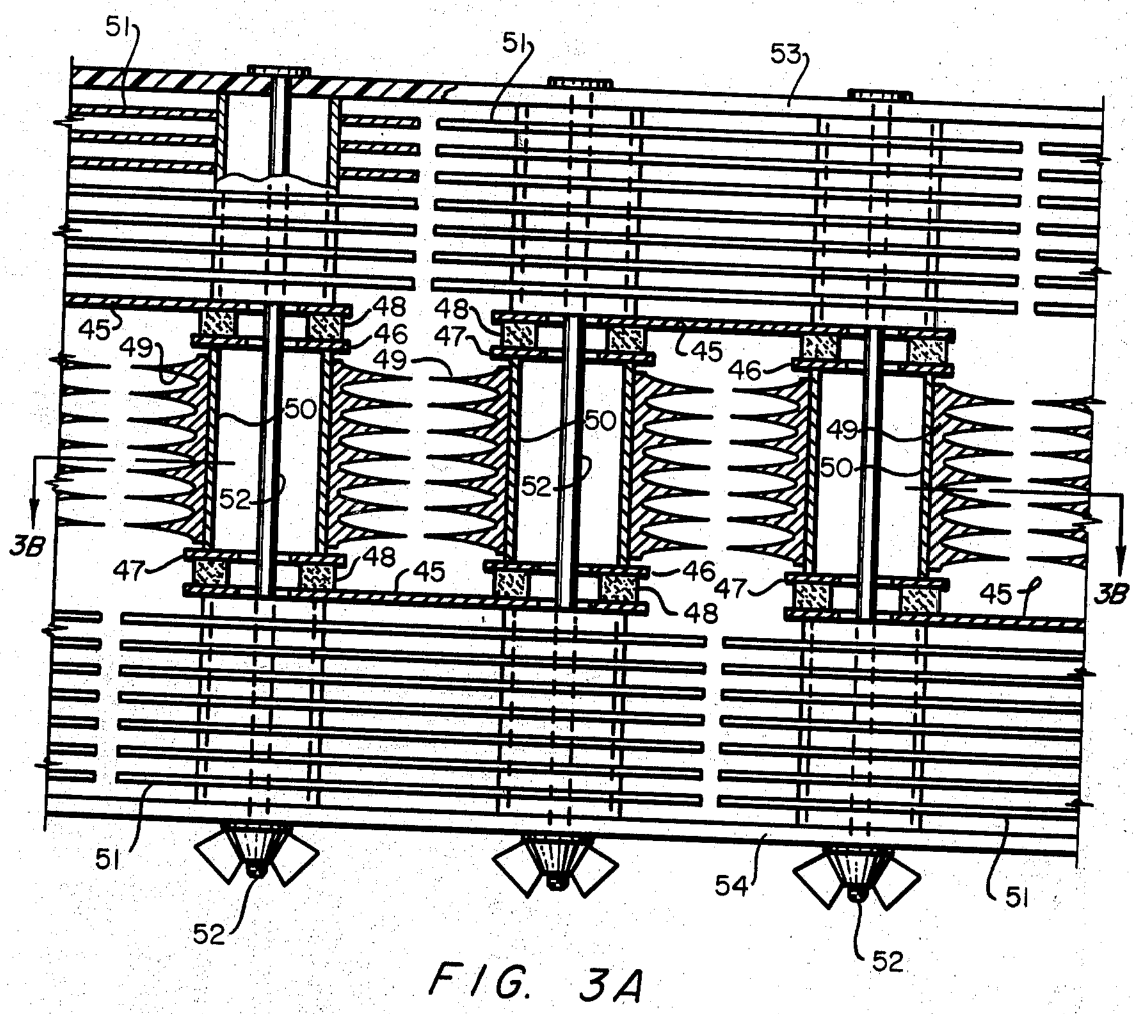
FIG. 3A shows an elevation view, partly in section, of another thermocouple assembly for an air to air system according to the invention.
Figure 3B:
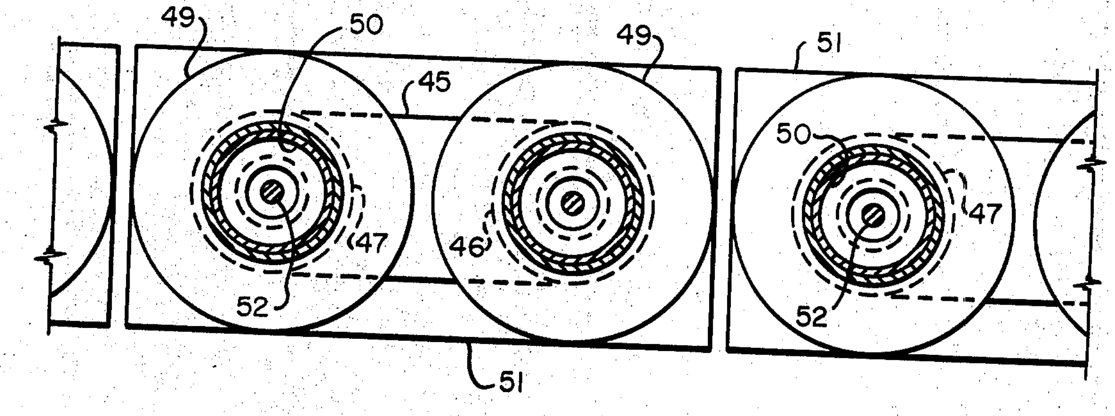
FIG. 3B is a sectional view taken along line B—B of FIG. 3A.

In FIGS. 3A and 3B there is shown a modification of the air to air system according to FIGS. 2A and 2B. The assembly is, as before, built from prefabricated couple assemblies comprising a copper junction strap 45 and free copper members 46 and 47 and semiconductive layers 48. The semiconductive layers 48 are suitably held in position between the ends of the strap 45 and the free copper members 46 and 47 so that when pressure is applied to the assembly, as described, there is formed good electrical conductive connection therebetween. For better conduction, the copper bar and members may be treated, for example, by nickel plating and flashing with a thin layer of soft metal such as gold or silver. The semiconductive layers may be held in place by a plastic frame secured to the members 46 and 47 and the strap 48. A junction bridge between two free members is, in this case, formed by a finned tubing section 49 with a copper center 50 in pressure contact with respective free members to form an electric path with thermocouples in series. The finned tubing section 49 serves as a heat-absorbing member when constituting a cold junction bridge, in which case the copper strap 45 constitutes a hot junction bridge which must be provided with heat dissipating members. This is done, according to the invention, by pressing aluminum finned tubing sections 51 against the copper straps 45 on both sides of the cold junction sections 49 by the help of a central stainless steel rod 52 which holds the whole assembly together between the side members 53 and 54 as previously described. The electric path is through the middle section only including straps 45 and tubing 49.

Figure 4A:
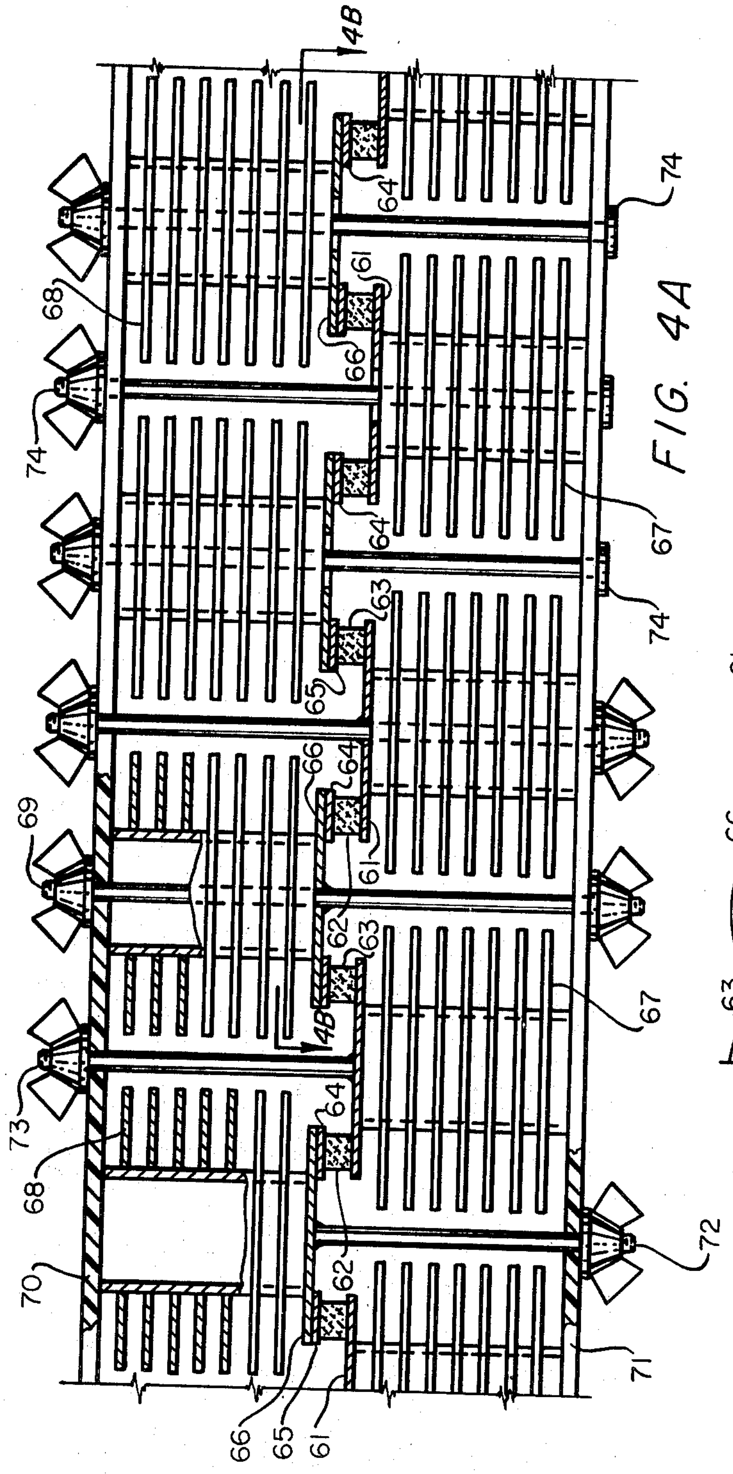
FIG. 4A shows an elevation view, partly in section, of still another thermocouple assembly for air to air systems according to the invention.
Figure 4B:
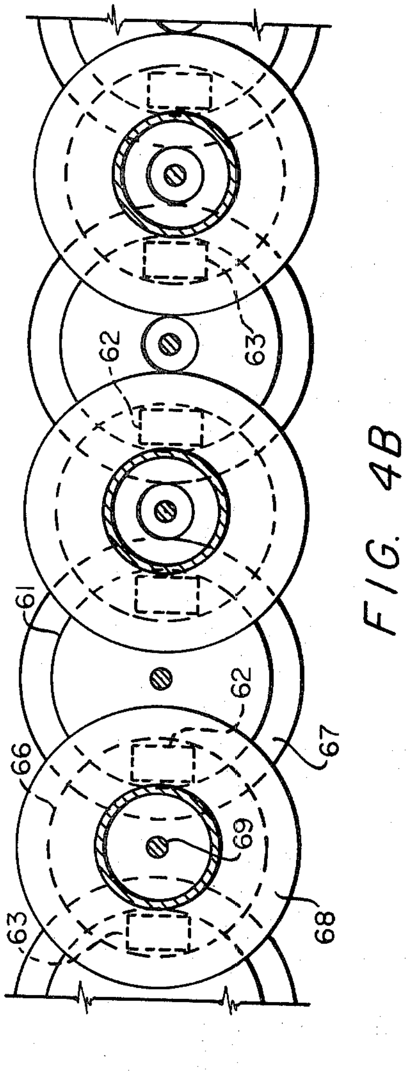
FIG. 4B is a sectional view taken along line B—B of FIG. 4A.

In FIGS. 4A and 4B there is shown an air to air system using aluminum finned tubings as heat-absorbing and heat-dissipating members. The finned tubing is not included in the electrical path. The electrical path is here formed by copper disc members 61 serving as junction bridges on which are pressed or soldered at opposite ends N-type and P-type layers of thermoelectric material in the form of round pellets or rectangular or square blocks 62 and 63 which, at their other junction ends, are joined to individual copper members 64 and 65, respectively, to form prefabricated couple assemblies with free ends. The free ends are joined by disc members 66 forming junction bridges of opposite type than the junction bridge members 61. The members 66 can also be directly joined to the semiconductive blocks in a prefabricated chain of thermocouples forming an electric path. As shown in the figures, the disc members 66 are in pressure contact with the free end members 64 and 65. The two junction bridges 61 and 66 are provided with heat transfer members in the form of finned tubing sections 67 and 68 of aluminum which, by stainless steel rods 69, are pressed with their center bases against the disc-shaped junction bridges for good heat transfer contact. In the described assembly, which is bolted between enclosing side members 70 and 71, there is only one finned tubing per junction bridge and the design is, therefore, suitable for relatively low capacity couples using moderate currents. The prestressing rods can be one-sided when firmly affixed to a junction bridge as illustrated by the rods 72 and 73. When extending to both side members through the finned tubings, the prestressing rod can still be firmly affixed to a junction bridge as illustrated by the rod 69. The rods 74 pass through central holes in the disc members and are affixed only to side members 70 and 71. Which of these alternatives to be used depends on the mounting method preferred.

Figure 5A:
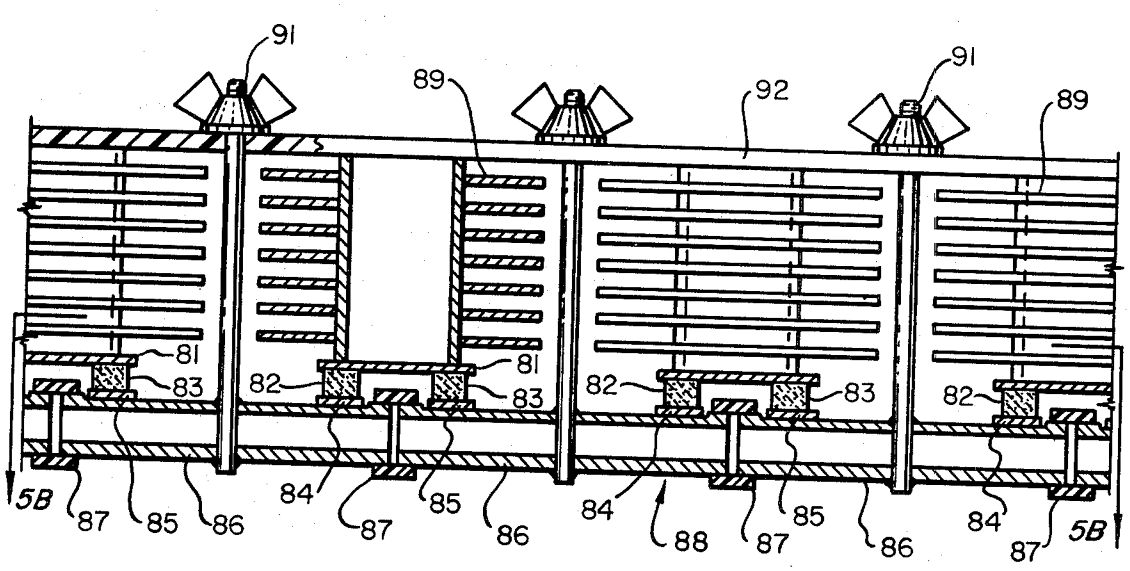
FIG. 5A shows an elevation view, partly in section, of a liquid to air assembly according to the invention.
Figure 5B:
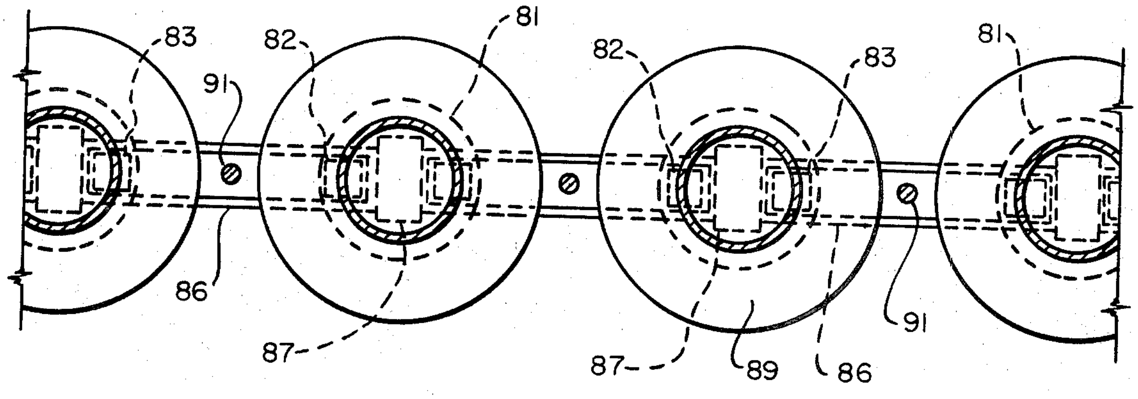
FIG. 5B is a sectional view taken along line B—B of FIG. 5A.

In FIGS. 5A and 5B there is shown another thermocouple assembly with only one finned tubing section per junction bridge on the air side. The assembly represents the air to liquid version of the air to air system shown in FIGS. 4A and 4B and is again based on prefabricated couple assemblies comprising a circular disc 81 serving as junction bridge between N-type and P-type bodies 82 and 83 joined diametrically opposite each other to the disc with similar junction ends. At the other end of the semiconductive bodies are copper members 84 and 85. The other junction bridges are in the form of copper pipe sections 86, which are joined by non-conductive ring members 87 into a continuous liquid conduit 88. The electric path for thermocouples in series is formed by the circular disc 81 through a semiconductive layer 83 of one type through a pipe section 86 and over a semiconductive layer 82 of dissimilar type to another circular disc 81, and so on. Each circular junction bridge 81 serves as a base for an aluminum finned tubing section 89 pressed against the junction bridge by means of a stainless steel rod 91 firmly affixed to the pipe section 86. The whole assembly is tied to a mounting panel 92 of non-conductive material, such as hardboard or plastic board. The applied prestressing of the assembly serves as before, both as protection of the fragile semiconductive material and for creation of pressure contacts of various types within the system as previously described.

Figure 6A:
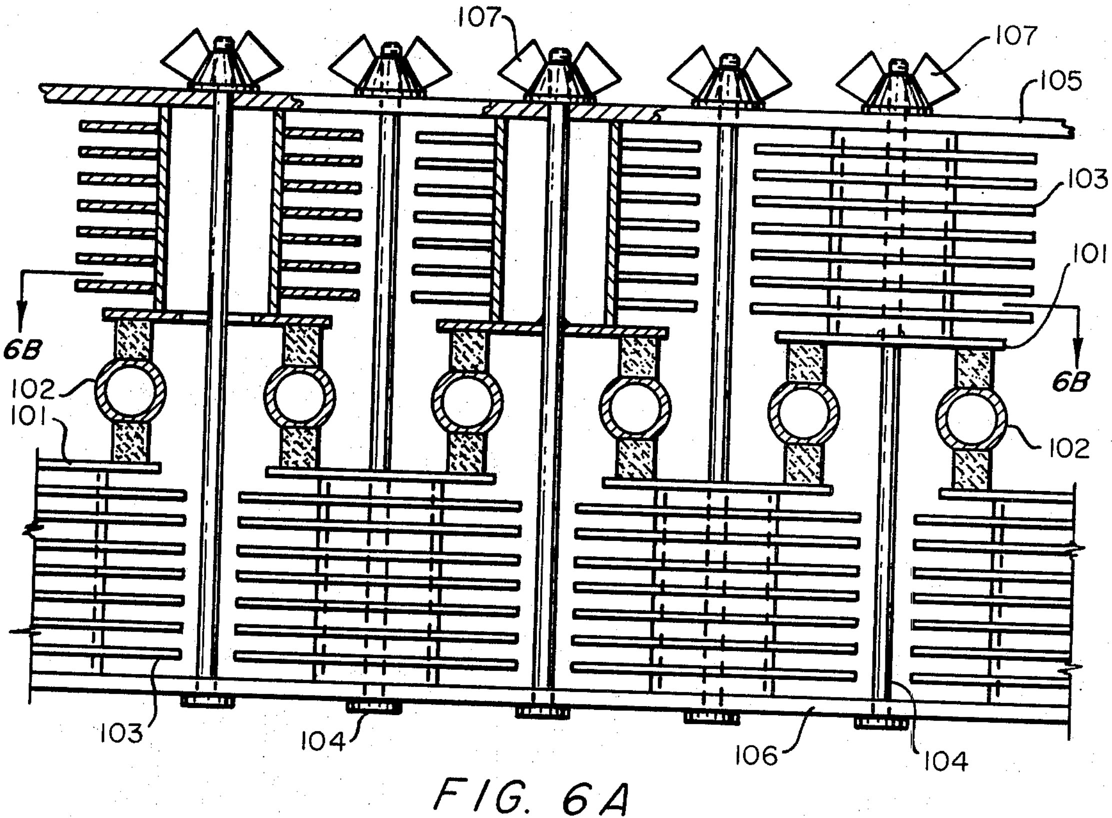
FIG. 6A is an elevation view, partly in section, of another liquid to air assembly according to the invention.
Figure 6B:
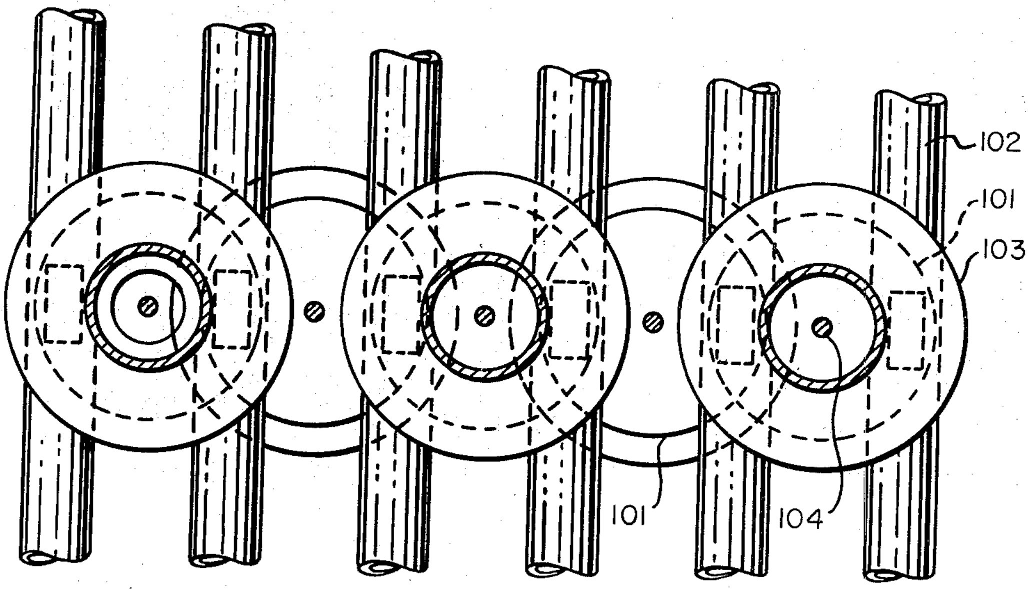
FIG. 6B is a sectional view taken along line B—B of FIG. 6A.

In FIGS. 6A, 6B, there is shown another liquid to air assembly. The liquid to air assembly shown includes one finned tube section per junction bridge on the air side of the assembly. Disc-shaped junction bridges 101 are joined to similar junction ends of N-type and P-type semiconductor bodies placed diametrically opposite each other. The other junction bridges are in the form of copper pipe sections 102 forming a part of the parallel liquid conduits. The pipe sections 102 forming each of the junction bridges along a pipe or conduit are separated from one another by non-conductive collars suitably sealed to adjacent pipe sections. The pipe sections 102 may include flattened portions adapted to receive the adjacent semiconductor bodies of dissimilar types on opposite sides thereof. The disc-shaped junction bridges 101 are in press contact with the adjacent finned tubing sections 103. The finned tubing sections may be made of aluminum. The complete assembly can be secured together by means of rods 104 which extend between spaced panel members 105 and 106 and are provided with suitable tightening means as, for example, the wing nuts 107.

The invention is not limited to the designs shown in the figures but includes the general use of pressure contacts created by central rods for joints in the electric path as well as for joints outside the electric path. The former joints also include, according to the invention, critical joints to the semiconductive material itself. The joints outside the electric path include particularly heat transfer joints to aluminum parts with high electric contact resistance. Pressure contacts for such heat transfer parts can, according to the invention, be created by other methods than rods; for instance, by screwing tubing sections into sockets affixed to junction bridges. The junction bridges with heat transfer means, according to the invention, can be included not only in ordinary heat pumps but also in cascades for two or more steps.

I claim:

1. In a thermoelectric heat pump assembly comprising a plurality of couple or subcouple units connected in series by metal conductors serving as junction bridges and made from a material with high electric conductivity, each unit comprising at least one layer of semiconductor material with at least one of its hot and cold junction sides connected to a junction bridge and means for heat exchange to air, characterized in that the means for heat exchange to air comprises an individual finned aluminum section in direct electrical contact with the high electric conductivity junction bridge connected with said one side of the layer of the semiconductor material whereby said side of said layer is electrically and thermally connected to said aluminum section and compression means acting on the aluminum section so that the aluminum section is forced towards the corresponding semiconductive layer for prestressing the same and for creating a good heat conducting connection through pressure contact between each aluminum section and its associated junction bridge.

2. Thermoelectric heat pump assembly according to claim 1 characterized in that the junction bridge with high electric conductivity is electrically and thermally connected to the semiconductor layer solely by a pressure contact.

3. Thermoelectric heat pump assembly according to claim 1 characterized in that the heat exchanger to air comprises a finned tubing section of aluminum.

4. Thermoelectric heat pump assembly according to claim 1 characterized in that the semiconductor layer is an annular body or two or more bodies in an annular arrangement.

5. Thermoelectric heat pump assembly according to claim 1 characterized in that the semiconductor layer is on its other side electrically and thermally connected to a pipe section.

6. Thermoelectric heat pump assembly according to claim 5 characterized in that the compressing means comprises a metal bolt or rod from a material with a low heat conductivity such as stainless steel and firmly affixed by metal contact to the pipe section.

7. Thermoelectric heat pump assembly according to claim 5 characterized in that the pipe section is part of a conduit for passing a liquid.

8. Thermoelectric heat pump assembly according to claim 5 characterized in that the pipe section is bimetallic and provided with outwardly extended fins of aluminum.

9. Thermoelectric heat pump assembly according to claim 1 characterized in that the units in the assembly are in a lateral position in relation to each other and attached to at least one common side plate in a plane perpendicular to the current direction through the semiconductor layers.

10. Thermoelectric heat pump assembly according to claim 9 characterized in that the compression means serve as mounting means in the form of a bolt or rod extended through holes in the common side plate and that the compression takes place from the outside of the side plate by forcing the same against the aluminum sections towards the semiconductor layers in the assembly.

11. Thermoelectric heat pump assembly according to claim 1 characterized in that the compression means is connected with the metal conductor serving as junction bridge.

12. Thermoelectric heat pump assembly according to claim 1 characterized in that each unit comprises two semiconductor layers forming a thermocouple in which two similar sides of the semiconductor layers are connected by a junction bridge in the form of a pipe section.

13. Thermoelectric heat pump assembly according to claim 1 characterized in that the aluminum sections belonging to two adjacent units are provided with common fins.

14. Thermoelectric heat pump assembly according to claim 1 characterized in that the metal conductors serving as junction bridges are plated with a noble metal such as silver or gold.

15. A thermoelectric heat pump assembly according to claim 1 characterized in that the semiconductor layer on its other side is connected to means for heat exchange to air including an aluminum section in direct electrical contact with the high electric conductivity junction bridge connected with said other side of the layer of semiconductor material whereby said side of said layer is electrically and thermally connected to said aluminum section and that the aluminum section is forced towards the semiconductor layer by said prestressing mean for creating a good heat conducting connection through pressure contact between the aluminum section and the associated junction bridge.

References Cited

UNITED STATES PATENTS

| | | | |
|---|---|---|---|
| 775,188 | 11/1904 | Lyons et al. | 136—208 |
| 1,848,655 | 3/1932 | Petrik | 136—212 |
| 3,004,393 | 10/1961 | Alsing | 136—204 X |
| 3,111,432 | 11/1963 | Sickert et al. | 136—203 |
| 3,194,024 | 7/1965 | Bassett | 136—230 X |
| 3,196,620 | 7/1965 | Elfving | 136—204 X |
| 3,234,048 | 2/1966 | Nelson | 136—230 X |
| 3,273,347 | 9/1966 | Elfving | 136—204 X |
| 3,390,018 | 6/1968 | Habdas | 136—212 X |

FOREIGN PATENTS

| | | |
|---|---|---|
| 971,957 | 10/1964 | Great Britain. |

ALLEN B. CURTIS, Primary Examiner

U.S. Cl. X.R.

136—208, 211, 212, 230